United States Patent
Hopper et al.

(10) Patent No.: US 8,450,830 B2
(45) Date of Patent: May 28, 2013

(54) FORMING A FERROMAGNETIC ALLOY CORE FOR HIGH FREQUENCY MICRO FABRICATED INDUCTORS AND TRANSFORMERS

(75) Inventors: Peter J. Hopper, San Jose, CA (US); William French, San Jose, CA (US); Andrei Papou, San Jose, CA (US); Dok Won Lee, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 34 days.

(21) Appl. No.: 13/230,596

(22) Filed: Sep. 12, 2011

(65) Prior Publication Data

US 2013/0062729 A1    Mar. 14, 2013

(51) Int. Cl.
| | |
|---|---|
| H01L 27/08 | (2006.01) |
| H01L 29/00 | (2006.01) |
| H01L 21/00 | (2006.01) |
| H01F 17/06 | (2006.01) |
| H01F 7/06 | (2006.01) |
| H01F 27/24 | (2006.01) |
| H01F 3/04 | (2006.01) |

(52) U.S. Cl.
USPC ............. 257/531; 257/295; 257/528; 438/3; 336/175; 336/219; 29/607; 29/609

(58) Field of Classification Search
USPC .. 257/295, 528; 438/3; 336/175, 219; 29/607, 29/609
See application file for complete search history.

(56) References Cited

U.S. PATENT DOCUMENTS

| | | | | |
|---|---|---|---|---|
| 6,452,247 | B1 * | 9/2002 | Gardner | 257/528 |
| 7,327,010 | B2 * | 2/2008 | Gardner | 257/528 |
| 7,705,411 | B2 * | 4/2010 | Smeys et al. | 257/415 |
| 2008/0299759 | A1 * | 12/2008 | Chatterjee et al. | 438/623 |
| 2009/0256667 | A1 * | 10/2009 | Smeys et al. | 336/175 |
| 2012/0280781 | A1 * | 11/2012 | Smeys et al. | 336/219 |

OTHER PUBLICATIONS

Part et al. "Ultralow-Profile Micromachined Power Inductors With Highly Laminated Ni/Fe Cores: Application to Low-Megahertz DC-DC Converters", IEEE Transactions on Magnetics, vol. 39, No. 5, Sep. 2003, pp. 3184-3186.*

* cited by examiner

*Primary Examiner* — Cheung Lee
*Assistant Examiner* — Jeremy Joy
(74) *Attorney, Agent, or Firm* — Eugene C. Conser; Wade J. Brady, III; Frederick J. Telecky, Jr.

(57) ABSTRACT

A plurality of sequential electro-deposition, planarization and insulator deposition steps are performed over a patterned thick photoresist film to form a laminated ferromagnetic alloy core for micro-fabricated inductors and transformers. The use of a plurality of contiguous thin laminations within deep patterns on non-removable photoresist film provides sufficient volume of magnetic film in, for example, high frequency applications, and reduces eddy current loss at high frequency.

20 Claims, 2 Drawing Sheets

FORMING A FERROMAGNETIC ALLOY CORE FOR HIGH FREQUENCY MICRO FABRICATED INDUCTORS AND TRANSFORMERS

RELATED APPLICATION

This application is related to co-pending and commonly-assigned U.S. patent application Ser. No. 13/230,635, filed on Sep. 12, 2011, and titled "A Method of Selectively Etching a Conductive Seed Layer in the Damascene Electroplating of Magnetic Alloy Laminations."

FIELD OF THE INVENTION

The present invention relates generally to integrated circuit technology and, in particular, to the formation of a ferromagnetic alloy core for high frequency micro-fabricated inductors and transformers utilizing multiple electro-deposition and chemical mechanical polishing (CMP) steps over a patterned thick photoresistive film.

BACKGROUND OF THE INVENTION

Among the known methods for forming laminations in micro-fabricated high frequency inductors and transformers, the utilization of thick, non-removable photoresist (PR) is the most efficient since it provides a high volume of magnetic material while maintaining the small thickness of the film, which is important for minimizing eddy current losses.

FIG. 1 shows a patterned layer of non-removable negative photoresist 100 formed on a substrate 102, e.g., a semiconductor substrate such as crystalline silicon. The patterned photoresist layer 100 includes a number of vias 104 formed to expose upper surface regions of the substrate 102. As shown in FIG. 1, each via 104 is lined on its bottom surface and sidewalls with copper seed material 106. A magnetic alloy lamination 108 is formed on the copper seed material 106.

With the continuous increase in frequency of operation in many IC applications (e.g., switching frequency of a buck converter), skin effect contribution into the power loss becomes more pronounced. An obvious solution is plating thinner magnetic films. However, this has the undesirable effect of reducing the cross-sectional area of the magnetic core which, in turn, linearly reduces the inductance.

SUMMARY OF THE INVENTION

In a disclosed embodiment, sequential electro-deposition, planarization and insulator deposition steps are performed over a patterned thick photoresist film to form a laminated ferromagnetic alloy core for micro-fabricated inductors and transformers. The use of a plurality of contiguous thin laminations within deep patterns in non-removable photoresist film provides sufficient volume of magnetic material in, for example, high frequency applications, and reduces eddy current loss at high frequency.

The features and advantages of the various aspects of the subject matter disclosed herein will be more fully understood and appreciated upon consideration of the following detailed description and accompanying drawings, which set forth illustrative embodiments in which the concepts of the claimed subject matter are utilized.

DETAILED DESCRIPTION

Figure 1:
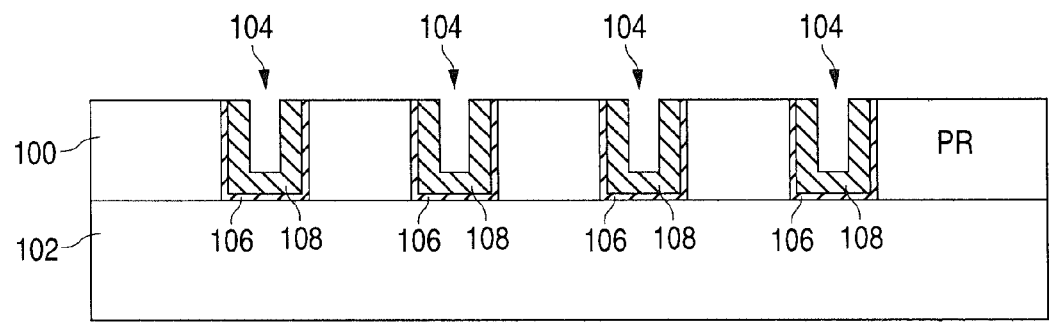
FIG. 1 is a cross section drawing illustrating a magnetic alloy core.

Illustrative embodiments of the invention are described below. In the interest of clarity, not all features of an actual implementation are described in this specification. It will of course be appreciated that in the development of any such actual implementation, numerous specific decisions must be made to achieve the designer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached drawings. Various structures and methods are schematically depicted in the drawings for purposes of explanation only and so as not to obscure the present disclosure with details that are well known to those skilled in the art. Nevertheless, the attached drawings are included to describe illustrative embodiments of the present disclosure. The words and phrases utilized herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by those skilled in the art, such a special meaning will be expressly set forth in the specification in a definitional manner that directly and unequivocally provides the special definition for the term or phrase.

As stated above, generally, the present disclosure provides methods for the formation of a ferromagnetic alloy core for high frequency micro-fabricated inductors and transformers utilizing multiple electro-deposition and chemical mechanical polishing (CMP) steps over a patterned thick film photorestive film. With reference to FIGS. 2A-2D, an illustrative embodiment will now be described in detail.

FIGS. 2A-2D illustrate a method of forming a laminated ferromagnetic core for use, for example, in high frequency inductors and transformers by sequentially plating a plurality of contiguous ferromagnetic laminations, separated by dielectric material, without depositing, exposing and developing new photoresist film for each ferromagnetic lamination. The method illustrated in FIGS. 2A-2D provides two ferromagnetic laminations. However, those skilled in the art will appreciate that the concept can be extended to a larger number of ferromagnetic laminations.

Figure 2A:
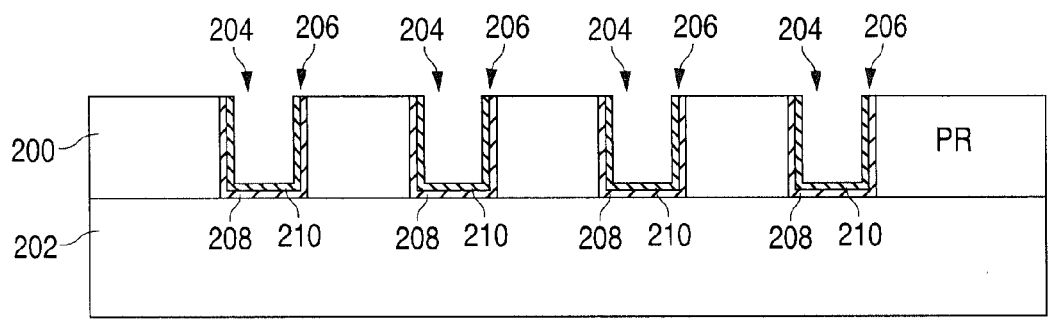
FIGS. 2A-2D are cross section drawings illustrating steps in a method of plating multiple thin magnetic film layers in a magnetic alloy core.

FIG. 2A shows the starting point for fabrication of the disclosed embodiment, which is similar to FIG. 1 except that the deposited ferromagnetic lamination is thinner and the seam inside the lamination is wider so that further processing will not be limited by the aspect ratio. More specifically, a patterned layer of non-removable negative photoresist 200, examples of which are well known to those skilled in the art (such as, for example, with the use of photo-imageable SU8 or BCB or polyimide or PBO epoxy systems) is formed on an underlying substrate 202, of silicon, glass, metal or laminate board, e.g., a semiconductor substrate such as crystalline silicon. The patterned photoresist layer 200 has a plurality of vias 204 formed therein. In the illustrated embodiment, each via 204 extends from the upper surface of the photoresist layer 200 to the upper surface of the substrate 202. A first conductive seed material layer (e.g. copper or Ti/Cu) is formed on the upper surface of the photoresist layer 200 and on the sidewalls and bottom surface of each via 204 by, for example, sputtering or atomic layer deposition (ALD). A first ferromagnetic material layer (e.g., NiFe, permalloy) is then formed on the conductive seed material layer by way of, for example, electrochemical deposition (ECD). As shown in FIG. 2A, the first ferromagnetic material layer and the first conductive seed material layer are then planarized (for example, by chemical mechanical polishing (CMP)) to remove the first ferromagnetic material layer and the first conductive seed material layer from the upper surface of the photoresist layer 200 to define a first ferromagnetic lamination 206 in each of the vias, the first ferromagnetic lamination 206 including a conductive seed material layer 208 formed on the sidewalls and bottom surface of the via 204 and a ferromagnetic material layer 210 formed on the conductive seed material layer 208.

Figure 2B:
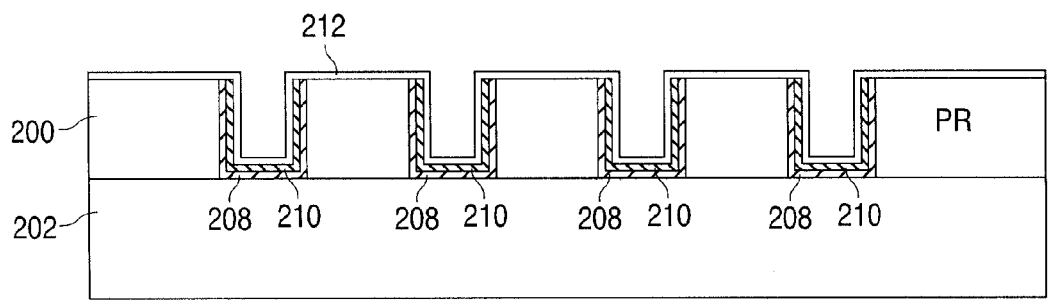
Figure 2C:
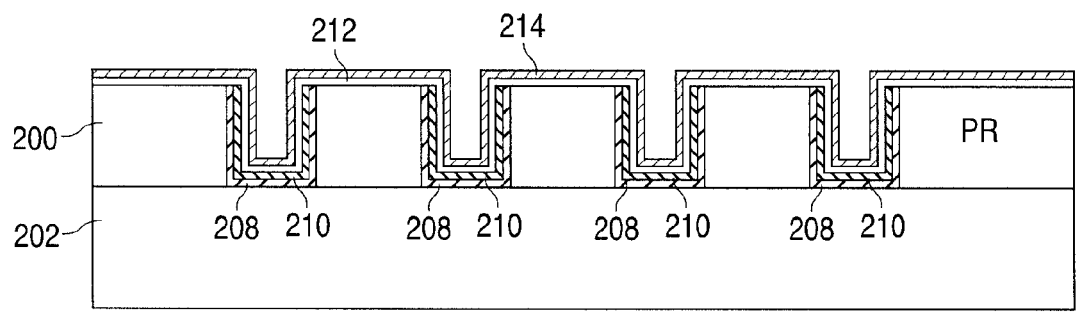

Next, as shown in FIG. 2B, a dielectric material layer 212 (e.g. silicon oxide) is formed, utilizing well known techniques, on the exposed upper surface of the photoresist layer 200 and on the surface of each first ferromagnetic lamination 206. A second conductive seed material layer 214 (e.g., copper or Ti/Cu) is then formed by, for example, sputtering or ALD, on the dielectric material layer 212, as shown in FIG. 2C. This is followed by the formation of a second ferromagnetic material layer (e.g., NiFe, permalloy) on the second conductive seed material layer 214.

Figure 2D:
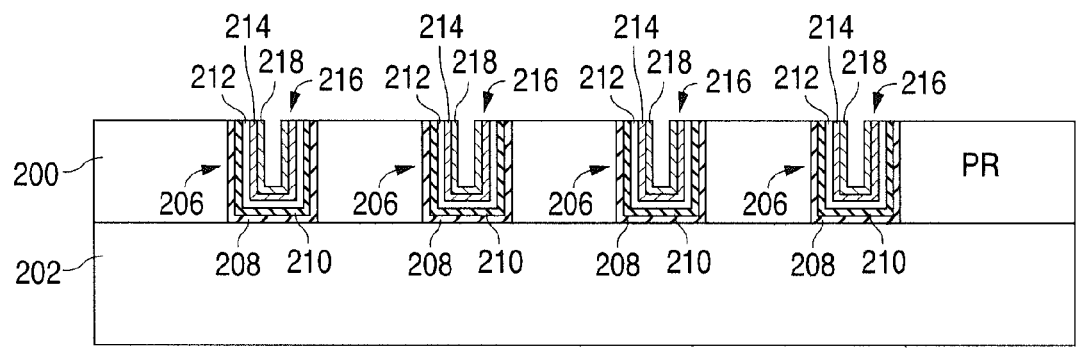

Referring to FIG. 2D, a planarization step (e.g., CMP) is then performed to remove the second ferromagnetic layer, the second conductive seed material layer 214 and the dielectric material layer 212 from the upper surface of the photoresist layer 200, thereby defining a second ferromagnetic lamination 216 in each of the vias 204 that is contiguous with the first ferromagnetic lamination 206 and separated from the first ferromagnetic lamination by the dielectric layer 212. As shown in FIG. 2D, each second ferromagnetic lamination 216 includes a conductive seed material layer 214 and a second ferromagnetic material layer 218 formed on the second conductive seed material layer 214.

Those skilled in the art will appreciate that, as stated above, additional ferromagnetic laminations may be formed in each of the vias 204 by the sequential formation of a dielectric material layer, conductive material seed layer and ferromagnetic material layer and subsequent planarization thereof, as described in conjunction with FIGS. 2A-2D.

It should be understood that the particular embodiments described herein have been provided by way of example and that other modifications may occur to those skilled in the art without departing from the scope of the claimed subject matter as expressed in the appended claims and their equivalents.

What is claimed is:
1. A laminated ferromagnetic alloy core for micro-fabricated high frequency inductors and transformers comprising:
a substrate, having a top and bottom surface;
a non-removable photoresist layer formed on the substrate, the photoresist layer having a plurality of spaced apart vias formed therein, exposing the top surface of the substrate; for each via, a plurality of contiguous laminations formed therein, each lamination including a conductive seed material layer and a ferromagnetic material layer, having a thickness, formed on the conductive seed material layer;
wherein the thickness of each ferromagnetic material layer is configured to minimize the eddy current losses at a given frequency of operation;
wherein each lamination includes a seam inside the lamination, configured in width so that further processing will not be limited by the aspect ratio;
the contiguous laminations having a dielectric layer formed therebetween;
wherein the number of contiguous laminations and the thickness of each lamination are configured to provide a sufficient volume of magnetic material to support high frequency applications and to reduce eddy current loss at high frequency respectively.

2. The laminated ferromagnetic alloy core for micro-fabricated high frequency inductors and transformers of claim 1, wherein the ferromagnetic material layer comprises NiFe.

3. The laminated ferromagnetic alloy core for micro-fabricated high frequency inductors and transformers of claim 1, wherein the conductive seed material layer comprises copper.

4. The laminated ferromagnetic alloy core for micro-fabricated high frequency inductors and transformers of claim 1, wherein the substrate comprises a semiconductor material.

5. The laminated ferromagnetic alloy core for micro-fabricated high frequency inductors and transformers of claim 4, wherein the semiconductor material comprises silicon.

6. The laminated ferromagnetic alloy core for micro-fabricated high frequency inductors and transformers of claim 1, wherein the dielectric layer comprises silicon oxide.

7. A method of forming a laminated ferromagnetic alloy core for micro-fabricated high frequency inductors and transformers, the method comprising:
providing a substrate, having top and bottom surfaces;
forming a layer a of non-removable photoresist on the substrate, the photoresist layer having a plurality of spaced apart vias formed therein, exposing the top surface of the substrate;
for each via, forming a plurality of contiguous laminations therein, each lamination including a conductive seed material layer and a ferromagnetic material layer, having a thickness, formed on the conductive seed material layer, the contiguous laminations having a dielectric layer formed therebetween;
wherein the thickness of each ferromagnetic material layer is configured to minimize the eddy current losses at a given frequency of operation;
wherein each lamination includes a seam inside the lamination, configured in width so that further processing will not be limited by the aspect ratio;
wherein the number of contiguous laminations and the thickness of each lamination are configured to provide a sufficient volume of magnetic material to support high frequency applications and to reduce eddy current loss at high frequency respectively.

8. The method of claim 7, wherein the ferromagnetic material layer comprises NiFe.

9. The method of claim 7, wherein the conductive seed material layer comprises copper.

10. The method of claim 7, wherein the substrate comprises a semiconductor material.

11. The method of claim 10, wherein the semiconductor layer comprises silicon.

12. The method of claim 7, wherein the dielectric layer comprises silicon oxide.

13. A laminated ferromagnetic core comprising;
a substrate, having an upper and bottom surface;
a non-removable photoresist layer formed on the substrate, the photoresist layer having a plurality of vias formed therein, each via extending from an upper surface of the photoresist layer to an upper surface of the substrate;

for each via, a plurality of contiguous laminations formed therein, each lamination including a copper seed layer and a ferromagnetic material layer, having a thickness, formed on the copper seed layer, the contiguous laminations having a dielectric layer formed therebetween;

wherein the thickness of each ferromagnetic material layer is configured to minimize the eddy current losses at a given frequency of operation;

wherein each lamination includes a seam inside the lamination, configured in width so that further processing will not be limited by the aspect ratio;

wherein the number of contiguous laminations and the thickness of each lamination are configured to provide a sufficient volume of magnetic material to support high frequency applications and to reduce eddy current loss at high frequency respectively.

14. The laminated ferromagnetic core of claim 13, wherein ferromagnetic material layer comprises NiFe.

15. The laminated ferromagnetic core of claim 14, wherein the substrate comprises a semiconductor material.

16. The laminated ferromagnetic core of claim 15, wherein the dielectric layer comprises silicon dioxide.

17. A method of forming a laminated ferromagnetic core, the method comprising:

providing a substrate, having an upper and bottom surface;

forming a non-removable photoresist layer on the substrate, the photoresist layer having a plurality of vias formed therein, each via extending from an upper surface of the photoresist layer to an upper surface of the substrate;

forming a first copper seed material layer on the upper surface of the photoresist layer and on the sidewalls and bottom surface of each via;

forming a first ferromagnetic material layer, having a thickness, on the first copper seed material layer;

wherein the thickness of the first ferromagnetic material layer is configured to minimize the eddy current losses at a given frequency of operation;

wherein the first lamination includes a seam inside the lamination, configured in width so that further processing will not be limited by the aspect ratio;

planarizing the first ferromagnetic material layer and the first copper seed material layer to remove the first ferromagnetic material layer and the first copper seed material layer from the upper surface of the photoresist layer, thereby defining a first ferromagnetic lamination in each of the plurality of vias;

forming a dielectric material layer on the upper surface of the photoresist layer and on a surface of each first ferromagnetic lamination;

forming a second copper seed material layer on the dielectric material layer;

forming a second ferromagnetic layer, having a thickness, on the second copper seed material layer;

wherein the thickness of the second ferromagnetic material layer is configured to minimize the eddy current losses at a given frequency of operation;

wherein the second lamination includes a seam inside the lamination, configured in width so that further processing will not be limited by the aspect ratio; and planarizing the second ferromagnetic material layer, the second copper seed material layer and the dielectric material layer to remove the second ferromagnetic material layer, the second copper seed material layer and the dielectric material layer from the upper surface of the photoresist layer, thereby defining a second ferromagnetic lamination in each of the vias that is separated from the first ferromagnetic lamination in said via by the dielectric material layer;

Continue forming copper seed layers on the dielectric material layers, forming ferromagnetic material layers, having a thickness, on the copper seed layers, forming dielectric material layers on the upper surface of the photoresist layer and on the surface of each ferromagnetic lamination and planarizing each ferromagnetic material layer, each copper seed material layer and each dielectric material layer to remove each ferromagnetic material layer, each copper seed material layer and each dielectric material layer from the upper surface of the photoresist layer, thereby defining ferromagnetic laminations in each of the vias that are separated from each previous ferromagnetic laminations in the via by the dielectric material layers;

wherein the thickness of each ferromagnetic material layer is configured to minimize the eddy current losses at a given frequency of operation;

wherein each lamination includes a seam inside the lamination, configured in width so that further processing will not be limited by the aspect ratio;

wherein the number of contiguous laminations and the thickness of each lamination are configured to provide a sufficient volume of magnetic material to support high frequency applications and to reduce eddy current loss at high frequency respectively.

18. The method of claim 17, wherein each planarization step comprises chemical mechanical polishing (CMP).

19. The method of claim 17, wherein each of the ferromagnetic material layers comprise NiFe.

20. The method of claim 19, wherein each of the dielectric material layers comprises silicon oxide.

* * * * *